United States Patent
Scharler et al.

(10) Patent No.: US 8,943,222 B1
(45) Date of Patent: Jan. 27, 2015

(54) SYSTEM, METHOD, AND COMPUTER READABLE MEDIUM FOR EMULATING A SENSOR

(75) Inventors: Peter Hans Scharler, Uniontown, PA (US); Robert Stanley Mawrey, Ashland, MA (US); Jason Thomas Winters, Winston-Salem, NC (US)

(73) Assignee: ioBridge, Inc., Marlborough, MA (US)

( * ) Notice: Subject to any disclaimer, the term of this patent is extended or adjusted under 35 U.S.C. 154(b) by 0 days.

(21) Appl. No.: 13/220,685

(22) Filed: Aug. 30, 2011

(51) Int. Cl.
  *G06F 15/16* (2006.01)
(52) U.S. Cl.
  USPC .......................... 709/246; 707/601; 707/602
(58) Field of Classification Search
  CPC ... H04W 4/001; H04W 4/046; H04W 84/005; H04W 84/18; H04W 12/06; H04W 16/00; H04W 84/10; H04W 88/00; H04W 88/16; H04W 28/04; H04W 28/044; H04W 40/10; H04W 4/006; H04W 4/008; H04W 4/02
  USPC ................................... 709/246; 707/601, 602
  See application file for complete search history.

(56) References Cited

U.S. PATENT DOCUMENTS

| | | | |
|---|---|---|---|
| 6,996,773 B2 * | 2/2006 | Friedman et al. | 715/240 |
| 7,298,259 B2 * | 11/2007 | Moriwaki | 340/539.22 |
| 7,379,474 B1 * | 5/2008 | Wong | 370/466 |
| 2009/0216827 A1 * | 8/2009 | Hirase et al. | 709/201 |

* cited by examiner

*Primary Examiner* — Douglas W Owens
*Assistant Examiner* — Monica C King
(74) *Attorney, Agent, or Firm* — Cesari and McKenna, LLP; Michael R. Reinemann

(57) ABSTRACT

A system, method, and computer readable medium for employing data obtained from an electronic network, such as the Internet, as an emulation of sensor data. A virtual sensor bridge mechanism may be interfaced to a data source, such as the Internet, to receive Web data or remote sensor data. The virtual sensor bridge may convert the received data into a format usable by a logic controller, thereby emulating sensor data and enabling the logic controller to treat the networked data source as a sensor. Furthermore, the virtual sensor bridge may interface directly with one or more sensors and may serve as an adapter or data relay between a sensor and the logic controller.

23 Claims, 2 Drawing Sheets

SYSTEM, METHOD, AND COMPUTER READABLE MEDIUM FOR EMULATING A SENSOR

CROSS-REFERENCE

This application claims the benefit of provisional patent application Ser. No. 61/378,207, filed Aug. 30, 2010, which is incorporated by reference, in its entirety, for all purposes.

TECHNICAL FIELD

This application relates generally to the reception of sensor data via a network. More particularly, the present invention relates to a system, method, and computer readable medium for receiving data via an electronic network and employing it to emulate local sensor data.

BACKGROUND

A sensor obtains a reading by monitoring something physical and converting that reading into measurable data. For example, in regards to a temperature sensor, as the temperature varies, so does the resistance on the sensor's wiring, and such variances may be measured. A sensor may also be configured to measure data in a binary fashion. For example, a house's power meter includes a dial that rotates based upon power usage. Every time the dial rotates, the power meter logs it, thereby tracking power usage. A sensor may interface with a logic controller. A logic controller may be a mechanism used to control automated processes. When interfaced with a sensor, a logic controller may convert analog data provided by the sensor into digital data, thereby enabling the logic controller to output a digital representation of this data.

Although useful, sensors are not always convenient or cost effective to employ. If an individual wishes to monitor a large area, such as a particular region or county, he may have to establish several sensors in that region to obtain his readings. Even if an individual needs only one sensor, the cost of a single sensor may be cost prohibitive, due to the sensor's initial cost or due to the costs involved in its maintenance. Furthermore, it can be difficult to establish communication between a localized logic controller and one or more remote sensors.

Furthermore, multiple sensors monitoring the same phenomenon can be redundant. For example, several individuals may wish to track rainfall in a particular region. If each individual is unassociated with the others, each may employ a separate sensor in the same region to monitor the same condition.

The Internet provides a readily available way to share sensor data. For example, regional temperature data is widely available via several sources, such as local news Web sites, WeatherBug.com, and the like. Furthermore, the Internet provides a wide variety of data that may be measured, such as clicks, predictions (e.g., in the stock market, weather forecasts, etc.), user behavior, etc. However, there currently is no convenient manner in which one may utilize Web-based data in the same fashion as one might use data provided directly from a sensor.

What is needed is a mechanism to enable measurable data readily available via a network, such as the Internet, to be employed in a fashion akin to data obtained from a sensor. This data may be provided to a logic controller, thereby enabling the logic controller to interpret the data as if it was obtained from an interfaced sensor.

SUMMARY

The present invention addresses the aforementioned needs by providing a system, method, and computer readable medium for employing data obtained from an electronic network, such as the Internet, as an emulation of sensor data. A virtual sensor bridge mechanism may be interfaced to a data source, such as the Internet, to receive Web data or remote sensor data. The virtual sensor bridge may convert the received data into a format usable by a logic controller, thereby emulating sensor data and enabling the logic controller to treat the networked data source as a sensor. Furthermore, the virtual sensor bridge may interface directly with one or more sensors and may serve as an adapter or data relay between a sensor and the logic controller.

BRIEF DESCRIPTION OF THE DRAWINGS

In order to describe the manner in which the above-recited and other advantages and features of the invention may be obtained, a more particular description of the invention briefly described above will be rendered by reference to specific embodiments thereof that are illustrated in the appended drawings. Understanding that these drawings depict only typical embodiments of the invention and are not therefore to be considered limiting of its scope, the invention will be described and explained with additional specificity and detail through the use of the accompanying drawings in which.

DETAILED DESCRIPTION

Various embodiments of the invention are discussed in detail below. While specific implementations are discussed, it should be understood that this is done for illustration purposes only. A person with ordinary skill in the relevant art will recognize that other components and configurations may be used without departing from the spirit and scope of the invention.

Virtual Sensor Network

Figure 1:
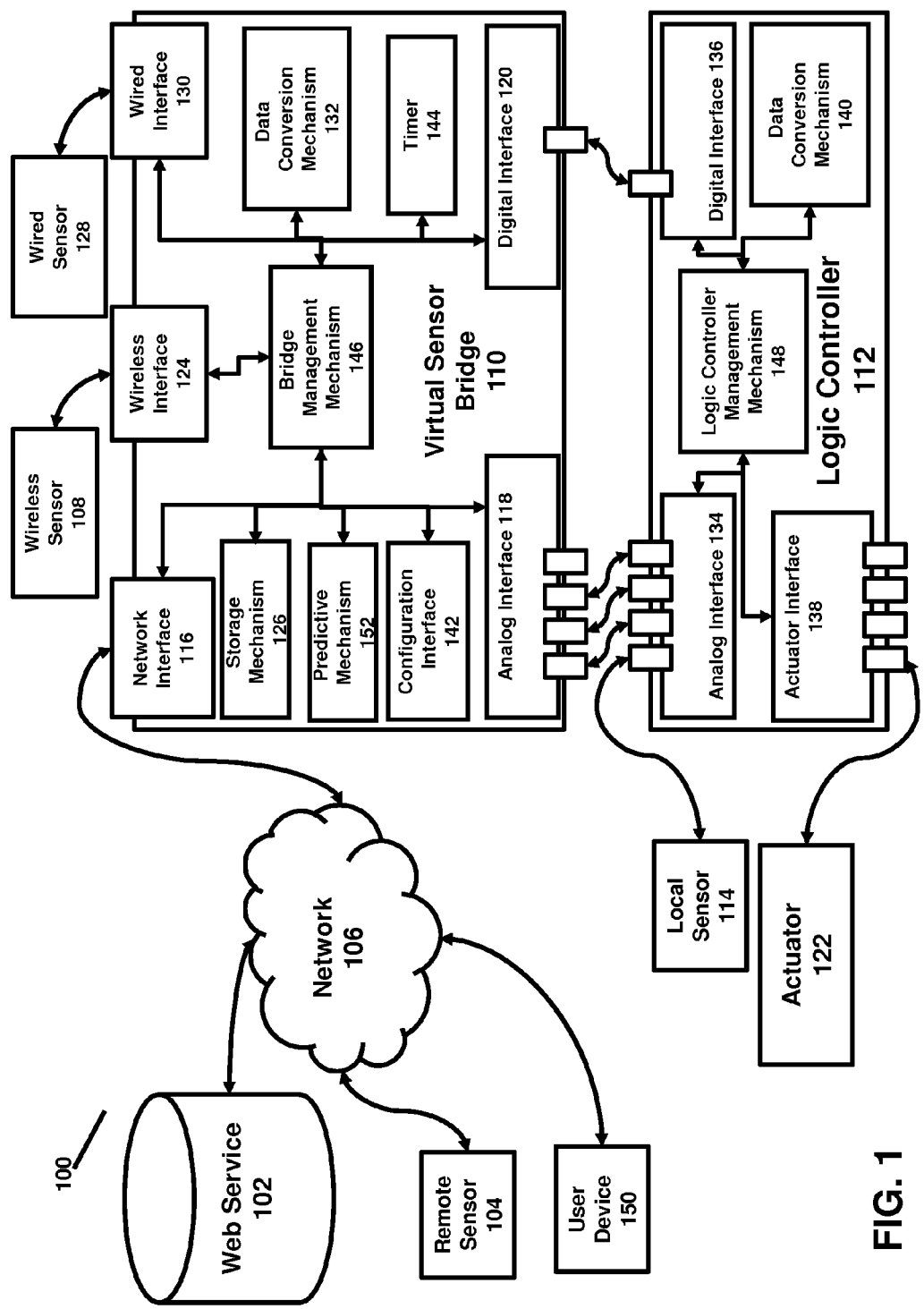
FIG. 1 illustrates a general architecture overview of an exemplary virtual sensor network according to an embodiment.

FIG. 1 illustrates a general architecture overview of virtual sensor network 100. Those with ordinary skill in the art will recognize that the logical components set forth in FIG. 1 are merely exemplary and that other configurations that provide substantially similar functionality may be used consistent with the scope of the disclosed subject matter. Although only a single instance of each component is depicted, this is for illustrative purposes and is not to be construed as limiting, and more than one instance may be included. Additionally, although each component is depicted and described as separate, this is not to be construed as limiting, and components may be combined per implementation. For example, virtual sensor bridge 110 and logic controller 112 may be included in one, larger component. As appropriate, the components depicted and/or referenced herein may include one or more of a computer processor, electronic components, such as a storage medium, a server, a database, etc., as would be appropriate, which may be used for processing, storing, transmitting and/or receiving data.

Components of virtual sensor network 100 may interface with one another via network 106, which may be any applicable electronic network. For example, network 106 may include a wide-area network (WAN), such as the Internet or a mobile network. Alternatively, or additionally, network 106 may include a local area network (LAN), a wireless local area network (WLAN), a personal area network (PAN), a wireless personal network (WPAN), a telephone network, etc.

Virtual Sensor Bridge

Virtual sensor network 100 may include virtual sensor bridge 110. Virtual sensor bridge 110 may be a mechanism configured to receive data from one or more of Web service 102, remote sensor 104, wireless sensor 108, wired sensor 128, etc. and communicate this data to logic controller 112 in a usable format. By doing so, virtual sensor bridge 110 may enable the emulation of sensor data to logic controller 112, allowing logic controller 112 to use data received from such components as it would data received from a sensor with which it is directly interfaced (e.g., local sensor 114). Virtual sensor bridge 100 may include one or more of a system, a device, a computer program, etc. as would be necessary to enable its functionality.

Virtual sensor bridge 110 may be enabled to communicate with network 106 via network interface 116, which may be any appropriate mechanism that may enable virtual sensor bridge 110 to interface with network 106. Virtual sensor bridge 110 may include bridge management mechanism 146, which may manage the flow of data between components, monitor and/or direct the activity of components, etc. Bridge management mechanism 146 may communicate with network interface 116 to enable the communication of data to and from network 106. For example, bridge management mechanism 146 may receive data sent by and/or may initiate data queries to Web service 102 or remote sensor 104. Bridge management mechanism 146 may determine the format of data received and determine the format into which received data is to be converted. In one scenario, bridge management mechanism 146 is a microcontroller.

Virtual sensor bridge 110 may receive data from one or more sources via network 106, such as from Web service 102, remote sensor 104, wireless sensor 108, and wired sensor 128. Such external component may initiate the communication of data to virtual sensor bridge 110 and/or virtual sensor bridge 110 may be configured to query such components for data.

Web service 102 may be a mechanism that provides Web data via network 106. For example, Web service 102 may be a weather service (e.g., WeatherBug.com), a social networking service (e.g., Facebook, Twitter, Google+, etc.), a search engine (Google.com), or any other Web-based mechanism that outputs Web data to network 106. Since Web service 102 may obtain its data from a sensor, virtual sensor network 100 may enable a user to employ any sensor feeding data into network 106 (e.g., the Internet). Alternatively, virtual sensor bridge 110 may receive open data from remote sensor 104 connect to network 106. The data feed from remote sensor 104 may be private or may be a publicly accessible. For example, network 106 may include a private network or the data provided by remote sensor 104 may be encrypted so that only virtual sensor bridge 110 may interpret it.

Network data, as used herein, may include Web data (e.g., data received from Web service 102), open data (e.g., data received from remote sensor 104), or any other data available via network 106. In one scenario, network data includes any measurable data published to the Internet. Virtual sensor bridge 110 may enable logic controller 112 to use network data in the same manner as it would data received from a sensor directly, but network data need not come from a sensor. For example, virtual sensor bridge 110 may receive network data pertaining to fluctuations in the stock market, how many clicks an electronic ad has received, how many times a Web page has been saved via a bookmarking utility (e.g., Delicious, Digg, Google Bookmarks, etc.), how many times a comment or page on a social networking site has been "liked," etc.

Virtual sensor bridge 110 may also interface directly with a sensor. For example, virtual sensor bridge 110 may include wireless interface 124 so that it may interact with wireless sensor 108, which may be a local sensor. Virtual sensor bridge 110 may interface with multiple wireless sensors 108 via wireless interface 124 and may be configured handle the addressing of each. Furthermore, wireless interface 124 may allow the user to employ virtual sensor bridge 110 as an adapter, enabling the use of wireless sensors with a logic controller 112 lacking its own wireless interface. Even if logic controller 112 is capable of receiving wireless data directly, virtual sensor bridge 110 may be used instead to lessen the workload of logic controller 112. For example, if the data provided wirelessly is not inherently usable by logic controller 112, virtual sensor bridge 110 may convert it into data usable by logic controller 112. Virtual sensor bridge 110 may interface with one or more wired sensors 128 via wired interface 130. Virtual sensor bridge 110 may be configured to interact with various types of sensors, including those not normally compatible with logic controller 112, thereby serving as a sensor adapter.

As virtual sensor bridge 110 may handle the receipt of sensor data from various sources (e.g., a local sensor, the Internet, a remote sensor, etc.), it may greatly simplify the configuration of a sensor system.

Virtual sensor bridge 110 may be enabled to communicate data to logic controller 112 via one or more of analog interface 118 and digital interface 120. Analog interface 118 and/or digital interface 120 may include one or more input/output (I/O) channel ports. Although virtual sensor bridge 110 is depicted as having both analog interface 118 and digital interface 120, this is for illustrative purposes and is not to be construed as limiting. It is to be understood that while virtual sensor bridge 110 may be designed to include both interfaces, it may alternatively include only analog interface 118 or digital interface 120. Furthermore, although FIG. 1 depicts virtual sensor bridge 110 as being interfaced to logic controller 112 via both analog interface 118 and digital interface 120, this is for illustrative proposes and is not to be construed as limiting. It is to be understood that while virtual sensor bridge 110 may interface with logical controller 112 via both interfaces, it may also interface with logic controller 112 via only analog interface 118 or digital interface 120. Furthermore, it is to be understood that analog interface 118 and/or digital interface may be either wired or wireless interfaces.

Virtual sensor bridge 110 may include data conversion mechanism 132, which may convert received data into a format usable by logic controller 112, thereby creating sensor emulation data. The sensor emulation data provided to logic controller 112 may be communicated in a format that is analogous to the format of sensor data, enabling logic controller 112 to treat the data in the same manner as it would direct sensor data. In one scenario, data conversion mechanism 132 parses received data to remove formatting such as Extensible Markup Language (XML) Hypertext Markup Language (HTML), JavaScript Object Notation (JSON), comma-separated value (CSV) format, etc. to obtain usable data (e.g., numeric data) to be communicated to logic controller 112. For example, virtual sensor bridge 110 may receive a complete Web page data from a weather Web service and parse out all data except for a single temperature value. After parsing received data, data conversion mechanism 132 may convert it into analog data, such as an Analog Voltage Signal, an Analog Current Signal, a Pulse Width Modulation (PWM), etc., via any known conversion process. Received data provided by a local sensor, such as wireless sensor 108 or wired sensor 128 may be converted, if need be, into any format usable by logic controller 112.

Virtual sensor bridge 110 may communicate sensor emulation data to logic controller 112 via analog interface 118. If logic controller 112 is capable of handling digital data, virtual sensor bridge 110 may communicate sensor emulation data as digital data via digital interface 120. Virtual sensor bridge 110 need not convert data if it is received in a usable format. For example, if virtual sensor bridge 110 receives network data in a digital format usable by logic controller 112, it may communicate this data to logic controller 112 without converting it.

Configuration interface 140 may enable a user to configure virtual sensor bridge 110 so that data conversion mechanism 132 may convert received data into a desired format. For example, a user may employ user device 150, which may be a personal computer (e.g., desktop computer, laptop computer, tablet computer, etc.) a mobile device (e.g., mobile phone, smartphone, etc.), etc. to configure virtual sensor bridge 110. For example, a user may configure a scale range for the conversion of network data into analog data and data conversion mechanism 132 may convert received data into an analog signal accordingly. A user may interact with configuration interface 140 via user device by way of a computer program, via a Web-interface (e.g., a Web page or a Web widget), etc.

Virtual sensor bridge 110 may include timer 144 which may enable virtual sensor bridge 110 to perform one or more tasks at one or more designated times. For example, timer 144 may track a particular time at which virtual sensor bridge 110 is to seek to obtain network data from Web service 102 and/or remote sensor 104. Timer 144 may be configured to cause virtual sensor bridge 110 to initiate an action at a designated date and/or time (e.g., Aug. 18, 2012 at 8:00 AM), on a set interval (e.g., every hour, once a day, etc.), on a set schedule (e.g., every Friday) etc. A user may configure timer 144 by accessing configuration interface 140.

Virtual sensor bridge 110 may store data in storage mechanism 126, which may be random-access memory (RAM), Electrically Erasable Programmable Read-Only Memory (EEPROM), a secure data (SD) card, a database, etc. In one scenario, data is stored with a time reference that includes the date and/or time, such as a time stamp. Storage mechanism 126 may store network data, sensor data, sensor emulation data, configuration data, or any other data relevant to the functioning of virtual sensor bridge 110.

Virtual sensor bridge 110 may include predictive mechanism 152. As described in further detail below, predictive mechanism 152 may enable virtual sensor bridge 110 to use stored data (e.g., stored network data, stored sensor emulation data, or stored sensor data) and/or live received data for one or more predictive processes.

Logic Controller

Logic controller 112 may be any mechanism capable of employing data received from virtual sensor bridge 110 or sensor 114. Logic controller 112 may use received data to control an automated process and may be a component of, or interfaced with, a system. For example, logical controller 112 may be part of a thermostat system, an irrigation control system for watering a lawn or farm, a data storage system, etc.

Logic controller 112 may include logic controller management mechanism 148 which may manage the flow of data between components, monitor and/or direct the activity of components, etc. In one scenario, logic controller management mechanism 148 is a microcontroller.

In one embodiment, logic controller 112 may be the module described in patent application Ser. No. 12/629,455, entitled "Module-based Device Interaction System," filed Dec. 2, 2009, which is incorporated by reference herein, in its entirety, for all purposes.

Logic controller 112 may include analog interface 134 and/or digital interface 136, which may be configured to receive data from virtual sensor bridge 110. Analog interface 134 and/or digital interface 136 may include one or more I/O channel ports. Although logic controller 112 is depicted as having both analog interface 134 and digital interface 136, this is for illustrative purposes and is not to be construed as limiting. It is to be understood that while logic controller 112 may be designed to include both interfaces, it may alternatively include only analog interface 134 or digital interface 136.

Logic controller 112 may manage the received data as it would data received from a local sensor, such as local sensor 114. For example, logic controller 112 may use the received data to initiate actuator 122, may log the received data, etc. Actuator 122 may be any mechanism that may be initiated by logic controller 112. For example, actuator 122 may be a triggering mechanism in an irrigation system, a thermostat, a data storage mechanism, etc. Although local sensor 114 is depicted as an analog sensor, this is for illustrative purposes and is not to be construed as limiting. Logic controller 112 may interface with a digital local sensor 114 via a digital interface.

Logic controller 112 may include its own data conversion mechanism (i.e., data conversion mechanism 140) and it may convert received data into a usable format. For example, if logic controller 112 receives analog data, data conversion mechanism 140 may convert it into a digital format. This may be necessary if logic controller 112, although designed to use digital data, is only configured to receive analog data (i.e., it does not include digital interface 136). Alternatively, logic controller 112 may not need to convert data received if the data is already in a usable format. For example, if logic controller 112 includes digital interface 136 and is able to uses digital data received from virtual sensor bridge 110, logic controller 112 may not need to convert the data.

In one embodiment, virtual sensor bridge 110 and logic controller 112 may be components of one device, thereby enabling a user to employ a single device to receive data via network 106 and employ it as sensor data. For example, digital interface 120 may be an internal connection between two components (i.e., virtual sensor bridge 110 and logic controller 112) of the same device.

Sensor Emulation

Figure 2:
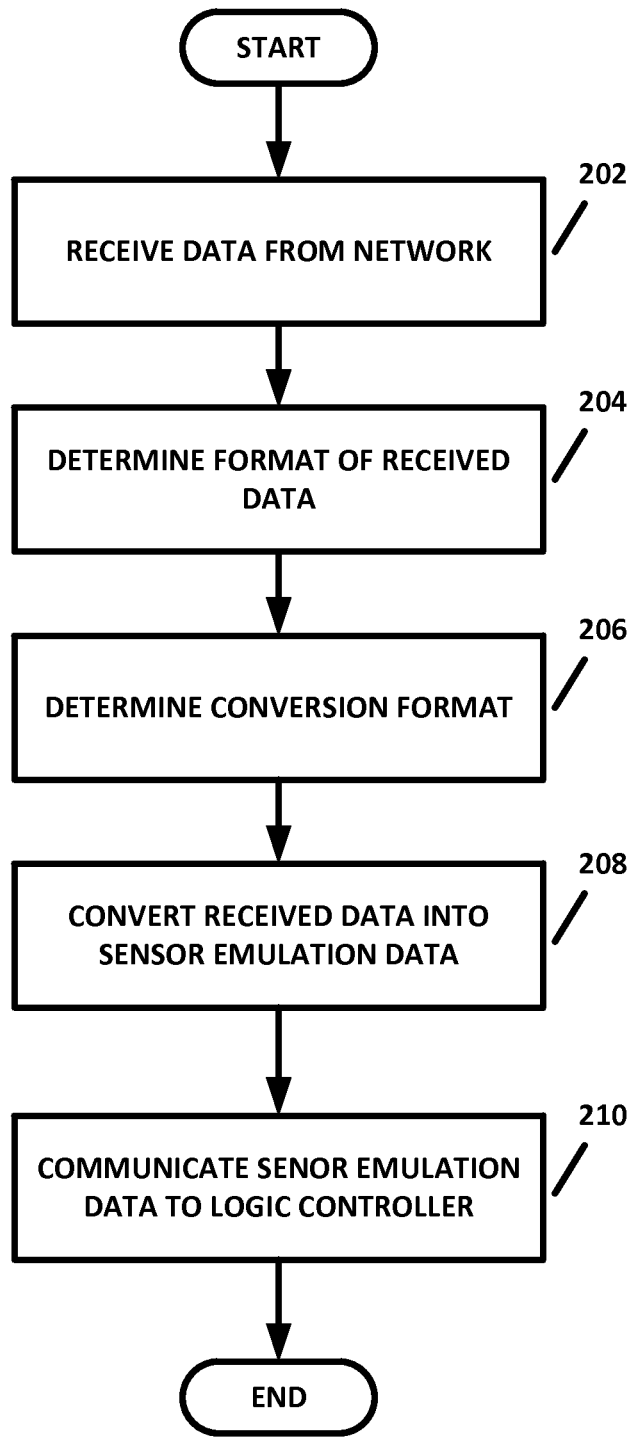
FIG. 2 depicts a flowchart of an exemplary process of processing data via a virtual sensor bridge according to an embodiment.

FIG. 2 depicts a flowchart of an exemplary process of processing data via virtual sensor bridge 110 according to an embodiment. Although the description herein is described mainly in terms of virtual sensor bridge 110 handling network data, this is not to be construed as limiting. As previously described, virtual sensor bridge 110 may receive data from a local sensor (e.g., wireless sensor 108 and/or wired sensor 128) and the description herein may be applicable to such locally-provided data instead of, or in addition to, network data.

Virtual sensor bridge 110 may receive data via network 106 via network interface 116 (step 202). For example, virtual sensor bridge 110 may receive temperature data from Web service 102 or from remote sensor 104. Virtual sensor bridge 110 may query for this data or it may be sent by Web service 102 and/or remote sensor 104. Virtual sensor bridge 110 may determine the format of the received data (step 204). For example, bridge management mechanism 148 may determine whether the received data is formatted in a Web-based format (e.g., XML, HTML, JSON, CSV, etc.) or in another digital format.

Virtual sensor bridge 110 may determine the format into which the received data is to be converted (step 206). The format may be determined based upon configuration set by a user. For example, data conversion mechanism 132 may determine which data is to be parsed out of the received data by determining which data is to be removed (e.g., Web formatting data) and which data is to be maintained (e.g., numeric data). Alternatively, or additionally, virtual sensor bridge 110 may determine if received data is to be converted into analog data.

The received data may be converted per the determined conversion format (step 208). Once the data has been converted into sensor emulation data, virtual sensor bridge 110 may communicate the sensor emulation data to logic controller 112 (step 210). As the data received by logic controller 112 may be in a format analogous to the data received form of a sensor, logic controller 112 may treat the data as it would data received directly from a sensor.

Historical Data

As mentioned, virtual sensor bridge 110 may store data it receives and/or process (e.g., network data, sensor data, sensor emulation data, etc.) via storage mechanism 126 and may associate this data with a time reference. Predictive mechanism 152 may be configured to use this historical data for one or more purposes. For instance, a user may use virtual sensor bridge 110 in order to measure data readings over an extended time period and/or to employ the data for predictive purposes. For example, if virtual sensor bridge 110 is ever disconnected from network 106, wireless sensor 108, or wired sensor 128 (e.g., due to a loss of network connection, signal loss, power outage, etc.), stored historical data may be employed to simulate received data. For example, predictive mechanism 152 may analyze data stored over a particular time period, determine if there is a historical pattern, and then determine the likely data reading for the time period of the loss of connection, thereby enabling logic controller 112 to continue to function as normal. Once the connection is reestablished, virtual sensor bridge 110 may synchronize with the data source (e.g., Web service 102, remote sensor 104, etc.) and update its log with actual data from the period of disconnect. Stored data may be given an expiration data and may be purged once that expiration data has been reached.

Because virtual sensor bridge 110 may employ any data available via network 106 such as the Internet, predictive mechanism 152 may employ a historical data feed in addition to, or instead of, employing historical data logged in storage mechanism 126. For example, virtual sensor bridge 110 may receive data regarding weather forecasts, stock forecasts, etc. and predictive mechanism 152 may use this data instead of, or in addition to, stored historical data.

Examples of Uses

The following examples are provided for illustrative purposes and are not to be construed as limiting. It is to be understood that the disclosed subject may be applicable to various uses.

Historical data may be employed for predicative purposes. For example, a farmer may be dependent upon a crop susceptible to frost damage, such as cranberries. Frost damage may be prevented by spraying water on the crop, thereby preventing cold air from damaging or ruining it. However, if the water is applied too soon or too late, it will not be effective. Actuator 122 may be a controlling mechanism for an irrigation system designed to spray the crop automatically. Virtual sensor bridge 110 may be configured to obtain weather data from Web service 102, remote sensor 104, wireless sensor 108, and/or wired sensor 128 and the weather data may indicate when conditions are conducive or not conducive to frost. For example, virtual sensor bridge 110 may maintain temperature data obtained via network 106 or an interfaced sensor. Virtual sensor bridge 110 may analyze the stored historical data to determine if there is a pattern indicative of particular time frames in which one might or might not reasonably expect frost. If the data indicates that frost is likely at a particular time (e.g., the time of day when spraying water would be optimal), it may communicate this data to logic controller 112, which may in turn instruct actuator 122 to activate the irrigation system. If the data indicates that frost is not likely, it may communicate this data to logic controller 112, which may then not initiate actuator 122.

As another example, in areas where water is scarce, a building may be configured to store rain water for plumbing uses, such as for toilet water (i.e., water recycling). The rain water is stored in a tank which has a particular capacity and the stored rain water is periodically purged to keep it from becoming too stagnant. Actuator 122 may be the controlling mechanism for purging the stored rain water. Virtual sensor bridge 110 may be configured to obtain weather data from Web service 102, remote sensor 104, wireless sensor 108, and/or wired sensor 128 and the weather data may indicate when it is and is not likely to rain. For example, virtual sensor bridge 110 may maintain rainfall data obtained via network 106 or an interfaced sensor. Virtual sensor bridge 110 may analyze the stored historical data to determine if there is a pattern indicative of particular time frames in which one might or might not reasonably expect rainfall. If the data indicates that rainfall is likely forthcoming, it may communicate this data to logic controller 112, which may in turn instruct actuator 122 to purge the stored rain water (i.e., because the storage tank is likely to be replenished in the near future). If the data indicates that rainfall is not likely, it may communicate this data to logic controller 112, which may instruct the controlling mechanism to keep the stored water.

A system, method, and computer-readable medium for enabling the emulation of sensor data have been illustrated. It will be appreciated by those skilled in the art that other variations of the disclosed subject matter will be possible without departing from the scope of the disclosure.

These and other aspects of the present invention will become apparent to those skilled in the art by a review of the preceding detailed description. Although a number of salient features of the present invention have been described above, the invention is capable of other embodiments and of being practiced and carried out in various ways that would be apparent to one of ordinary skill in the art after reading the disclosed invention. Therefore, the description should not be considered to be exclusive of these other embodiments. Also, it is to be understood that the phraseology and terminology employed herein are for the purposes of description and should not be regarded as limiting.

The invention claimed is:

1. A method for enabling emulation of a signal produced by a sensor, the method comprising:
   receiving Web data via an Internet, wherein the Web data is digital data that is measureable data published to the Internet and received from a Web service interfaced with the Internet;
   converting the Web data into an analog signal, wherein the analog signal emulates a signal produced by a sensor;

communicating the analog signal to a logic controller via a sensor interface, thereby enabling the logic controller to utilize the analog signal and initiate an actuator;

wherein the Web service is comprising one or more of a weather service, a social networking service, and a search engine; and wherein the logic controller is one or more of a thermostat system, an irrigation control system, and a data storage system.

2. The method of claim 1, further comprising receiving configuration data, wherein the configuration data includes one or more of a Web data conversion setting, a time-related setting to be applied to the Web data, and a data storage setting.

3. The method of claim 1, further comprising storing one or more of the Web data and the analog signal.

4. The method of claim 1, further comprising, in order to determine a predictive pattern, analyzing one or more of the Web data, the analog signal, and other stored information.

5. A method for emulating a signal produced by a sensor, the method comprising:

receiving, via an Internet, Web data, wherein the Web data is digital data that is measureable data published to the Internet and received from a Web service;

determining a signal format into which to convert the Web data, wherein the signal format is an analog signal format usable by a logic controller;

converting the Web data into an analog signal based upon the signal format, wherein the analog signal emulates a signal produced by a sensor;

communicating the analog signal to a logic controller via a sensor interface, thereby enabling the logic controller to utilize the analog signal and initiate an actuator; and wherein the Web service is comprising one or more of a weather service, a social networking service, and a search engine.

6. The method of claim 5, wherein converting the Web data into the analog signal comprises parsing the Web data to remove one or more of Extensible Markup Language (XML) Hypertext Markup Language (HTML), JavaScript Object Notation (JSON), and a comma-separated value (CSV) format.

7. A method for emulating a signal produced by a sensor, the method comprising:

receiving one or more configuration settings, wherein the one or more configuration settings include an instruction for converting Web data that is digital data that is measureable data published to an Internet and received via the Internet from a Web service into a signal that emulates a signal produced by a sensor;

receiving the Web data that is digital data;

converting the Web data into an analog signal per the one or more configuration settings; and communicating the analog signal to a logic controller via a sensor interface, thereby enabling the logic controller to use the analog signal and further enabling the logic controller to initiate an actuator.

8. The method of claim 7, wherein a configuration setting includes an instruction for parsing the Web data.

9. The method of claim 7, further comprising querying the Web service for the Web data via the Internet.

10. The method of claim 1, further comprising querying the Web service for the Web data via the Internet.

11. The method of claim 1, further comprising converting the Web data into the analog signal by parsing the Web data to remove one or more of Extensible Markup Language (XML) Hypertext Markup Language (HTML), JavaScript Object Notation (JSON), and a comma-separated value (CSV) format.

12. The method of claim 1, wherein the actuator activates an irrigation system.

13. The method of claim 1, wherein the actuator is the controlling mechanism for purging stored water.

14. The method of claim 5, wherein the actuator activates an irrigation system.

15. The method of claim 5, wherein the actuator is the controlling mechanism for purging stored water.

16. The method of claim 5, further comprising, in order to determine a predictive pattern, analyzing one or more of the Web data, the signal, and other stored information.

17. The method of claim 5, further comprising querying the Web service for the Web data via the Internet.

18. The system of claim 7, further comprising, in order to determine a predictive pattern, analyzing one or more of the Web data, the signal, and other stored information.

19. The method of claim 7, wherein converting the Web data into the analog signal comprises parsing the Web data to remove one or more of Extensible Markup Language (XML) Hypertext Markup Language (HTML), JavaScript Object Notation (JSON), and a comma-separated value (CSV) format.

20. The method of claim 7, further comprising querying the Web service for the Web data via the Internet.

21. The method of claim 7, wherein the actuator activates an irrigation system.

22. The method of claim 7, wherein the actuator is the controlling mechanism for purging stored water.

23. The method of claim 7, wherein the Web service is a weather service, a social networking service, or a search engine.

* * * * *